United States Patent [19]

Arakawa

[11] Patent Number: 5,062,078
[45] Date of Patent: Oct. 29, 1991

[54] NONVOLATILE SEMICONDUCTOR MEMORY DEVICE OPERABLE IN DIFFERENT WRITE MODES

[75] Inventor: Norimasa Arakawa, Yokohama, Japan

[73] Assignee: Kabushiki Kaisha Toshiba, Kawasaki, Japan

[21] Appl. No.: 419,750

[22] Filed: Oct. 11, 1989

[30] Foreign Application Priority Data

Oct. 19, 1988 [JP] Japan .................................. 63-263149

[51] Int. Cl.[5] .............................................. G11C 11/00
[52] U.S. Cl. ................................. 365/189.07; 365/210
[58] Field of Search .................... 365/189.07, 210, 191

[56] References Cited

U.S. PATENT DOCUMENTS 4,280,197 7/1981 Schlig .............................. 365/230.05

OTHER PUBLICATIONS

Memory Components Handbook, chapter 4 EPROMS (for example, attached is 27256) Intel (1987) pp. 4-55 to 4-66.
Data Book, X28C256 in section 3, E2PROM Data Sheets, Xicor (1986) pp. 3-75 to 3-83.

Primary Examiner—Joseph A. Popek
Attorney, Agent, or Firm—Finnegan, Henderson, Farabow, Garrett, and Dunner

[57] ABSTRACT

A nonvolatile semiconductor memory device has a memory circuit proper, a mode selector, and pulse generating circuits. The memory circuit proper includes a plurality of nonvolatile memory cells. The mode selector is capable of generating at least two mode signals. The mode selector detects a signal indicative of a specific operation applied to the memory circuit proper, and selects one of the mode signals in accordance with the detected signal. The pulse generating circuits generate a first and a second program pulses. Each pulse allows data to be written into the memory circuit proper in different manners in accordance with the mode signal selected by the mode selector.

8 Claims, 7 Drawing Sheets

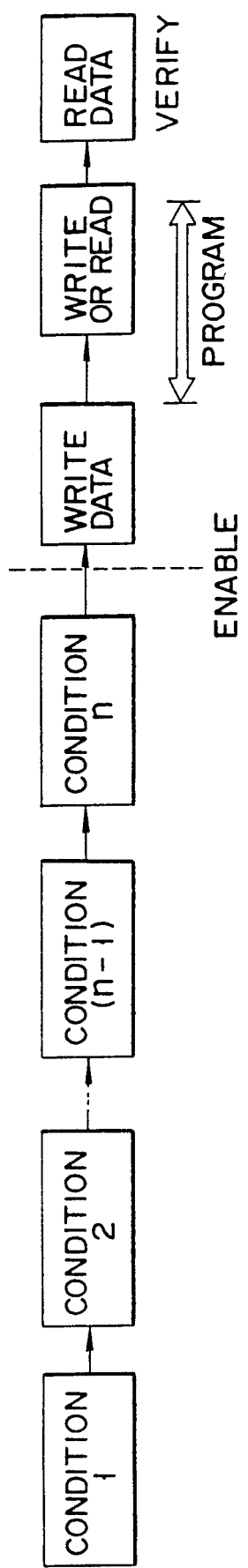
F I G. 2
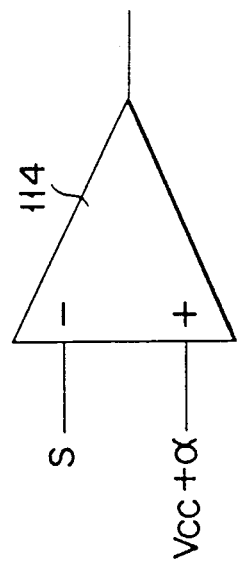
F I G. 3

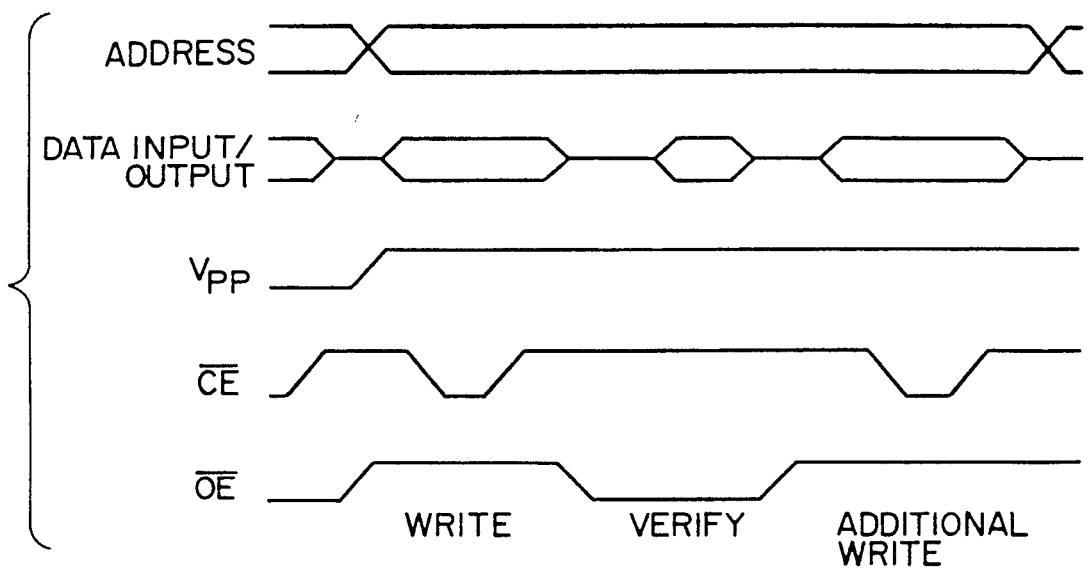
F I G. 4
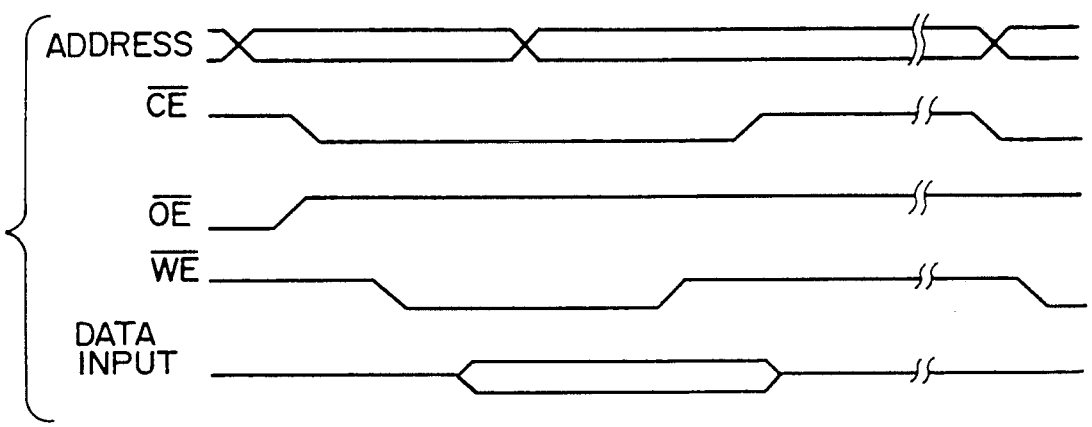
F I G. 5

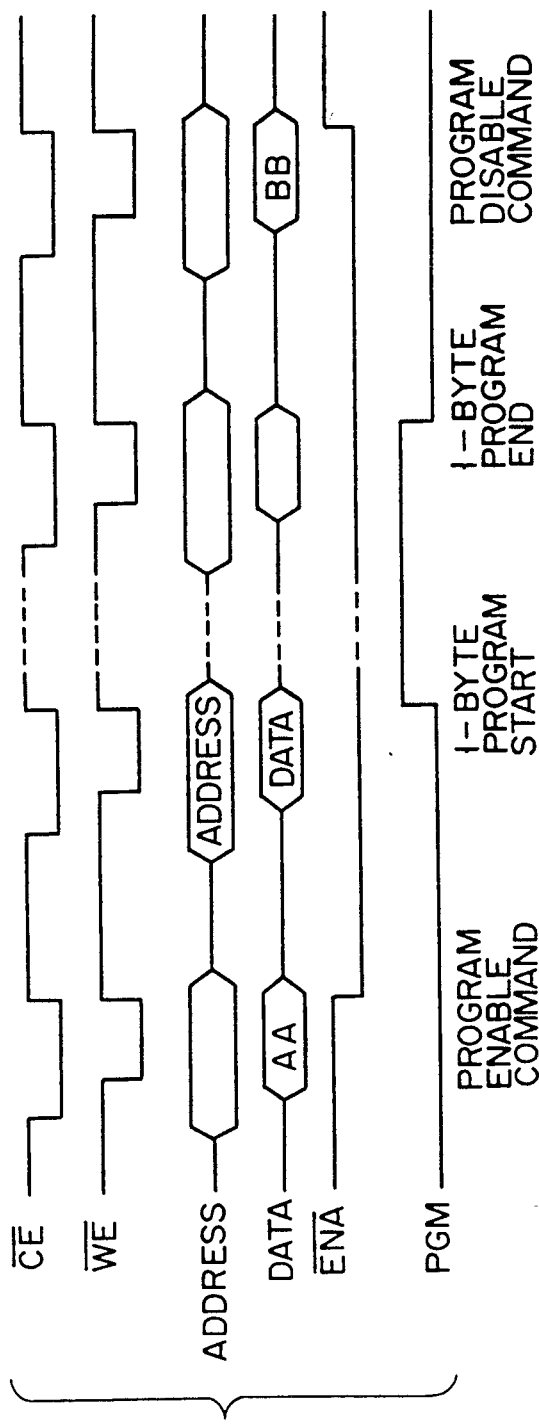
FIG. 12
FIG. 13

5,062,078

NONVOLATILE SEMICONDUCTOR MEMORY DEVICE OPERABLE IN DIFFERENT WRITE MODES

BACKGROUND OF THE INVENTION

1. Field of the Invention

The present invention relates to a semiconductor memory device, and more particularly to a reprogrammable nonvolatile semiconductor memory device.

2. Description of the Related Art

There has been known a semiconductor memory device of the type in which memory cells are constructed with nonvolatile transistors. This type of semiconductor memory device is called a nonvolatile semiconductor memory device. In this type of memory device, two types of data write modes are available. In a first data write mode, data is written into the memory cells of the memory device before the memory device is assembled into a system. For data write, a device exclusively used for writing data into the memory cells, such as a ROM writer, is used. An EPROM may be enumerated for this type of the memory device. In a second data write mode, data is written into the memory cells of the device assembled into a system. The data write operation is under control of various control signals derived from a CPU contained in the system. An EEPROM is an exemplar of this type of the memory device.

In the case of the memory device, such as an EPROM, which is operable in first data write mode using the ROM writer, much time is taken for writing data. Because of this, a special data write sequence is used for the data writing. This sequence is different from that by a CPU in a system to which the memory device is assembled. Accordingly, after data is written into a memory device by a ROM writer, and the device is assembled into a system, it is impossible to reprogram the data stored in the memory device left assembled. Some techniques by which the memory device assembled into a system is reprogrammable have been developed. In these techniques, new problems arise. For example, an intricated system configuration is required for realizing such techniques.

In the memory device, such as an EEPROM, which is operable in the second data write mode, that is, of the type in which after the memory device is assembled into a system, and data write progresses under control of control signals issued from a CPU contained in the system, a usual write sequence, not the special sequence, is used for the data writing. In the second write mode, the durations of the control signals from the CPU are greatly different from a data write time for writing data to the memory device. For example, the former ranges from several tens to several hundreds nS, while the latter several hundreds uS to several mS. To cope with this, a proposal has been made in which a one-shot pulse generator is used for generating a program pulse PGM (write pulse) which rises at the leading end of a $\overline{WE}$ signal and has a much larger duration than that of the $\overline{WE}$ signal. This proposal, however, involves another problem that the total of the write time is long. In the case of the memory device having no internal write control means, arrangement is made such that the write time is controlled by an external CPU. Since in such an arrangement, however, the write sequence is intricated, so that it is impossible to write data into the memory device assembled into a system by a ROM writer. As for the memory circuit before it is assembled into a system, the increase of the write time indicates increase of time to manufacture and hence increase of cost to manufacture.

SUMMARY OF THE INVENTION

Accordingly, an object of the present invention is to provide a nonvolatile semiconductor memory device selectively using on mode in which data is written into a memory circuit in response to control signals from a CPU and the other mode in which data write operations are performed by a ROM writer, after the memory circuit is assembled into a system.

To achieve the above object, there is provided a nonvolatile semiconductor memory device comprising:

a memory circuit proper including a plurality of nonvolatile memory cells;

mode select means, capable of generating at least two mode signals, for detecting a signal indicative of a specific operation applied to the memory circuit proper, and for selecting one of the mode signals in accordance with the detected signal; and control means for generating at least two write enable signals, each signal allowing data to be written into the memory circuit proper in different manners in accordance with the mode signal selected by the mode select means.

BRIEF DESCRIPTION OF THE DRAWINGS

Other objects, aspects, and features of the present invention will be apparent from the following description taken in connection with the drawings, in which:

FIG. 2 is a flowchart showing a sequence of writing data into a memory circuit of the memory device assembled into a system;

FIG. 3 shows an exemplary circuit of a mode selector used in the memory device of FIG. 1;

FIG. 4 is a timing, chart showing a data write operation of the memory device when data is written into the memory circuit of the memory device by a ROM writer;

FIG. 5 is a timing chart showing a data write operation of the memory device when data is written into the memory circuit of the memory device being assembled into a system;

FIG. 12 is a timing chart showing a data write operation of the memory device of FIG. 11; and FIG. 13 is a timing chart showing a write sequence which is different from that of FIG. 12.

DETAILED DESCRIPTION OF THE PREFERRED EMBODIMENT

A preferred embodiment of the present invention will be described with reference to the accompanying drawings.

Figure 1:
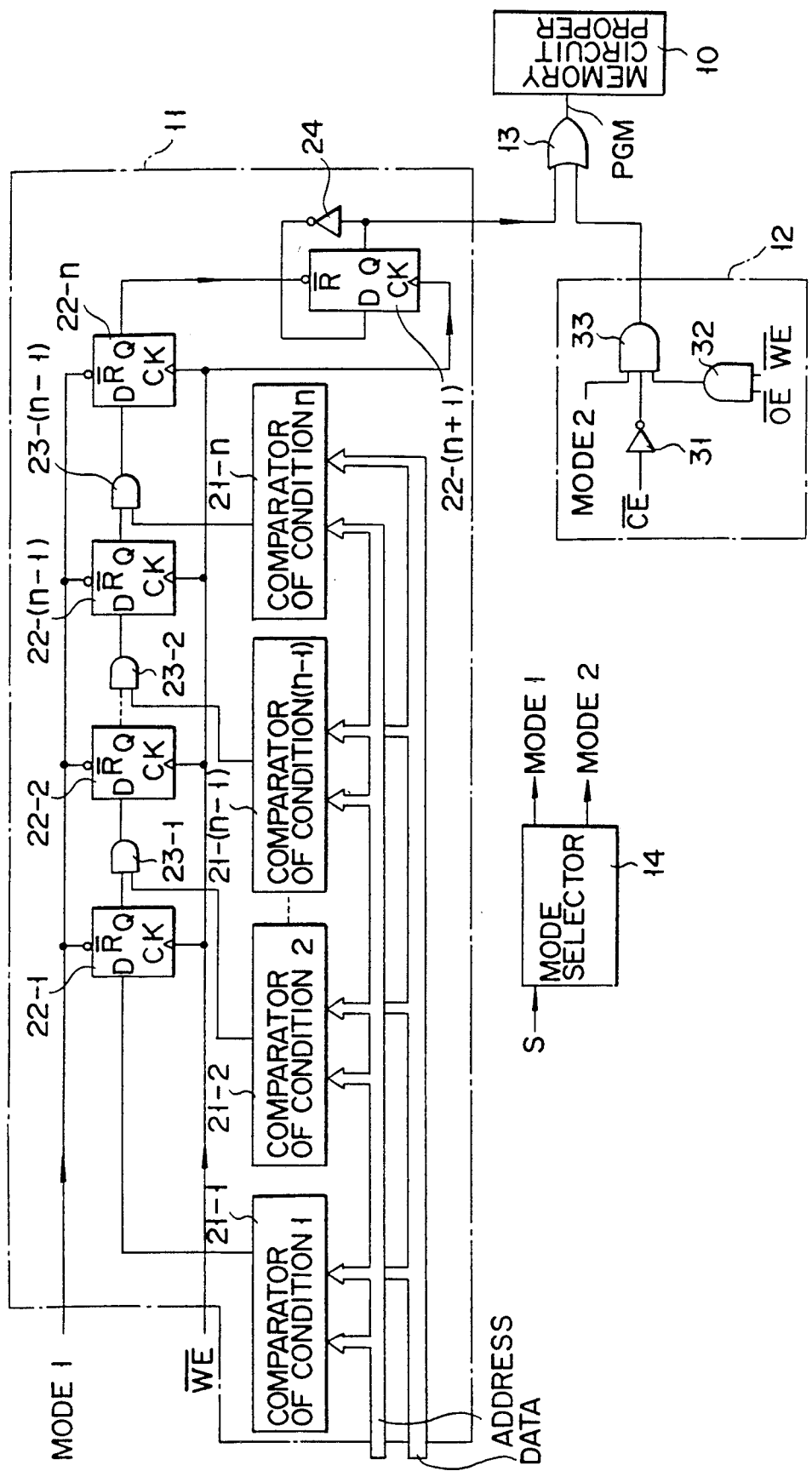
FIG. 1 shows a block diagram of an embodiment of a nonvolatile semiconductor memory device according to the present invention.

FIG. 1 shows an arrangement of an embodiment of a nonvolatile semiconductor memory device according to the present invention. As shown, the semiconductor memory device is made up of a memory circuit proper (referred to as a memory circuit) 10, a first program pulse generator 11, a second program pulse generator 12, and a mode selector 14.

The memory circuit 10 includes a number of memory cells each constructed with a nonvolatile transistor into which data is written during a period that a program pulse PGM to be described later is being supplied. The first program pulse generator 11 generates a program pulse PGM when data is written into the memory circuit 10 of the memory device being assembled into a system. The second program pulse generator 12 generates a program pulse PGM when data is written into the memory circuit 10 of the memory device by a ROM writer, for example, before it is assembled into a system. The output signals of the first and second program pulse generators 11 and 12 are coupled through an OR gate 13 to the memory circuit 10. The mode selector 14 generates one of the two types of mode signals MODE1 and MODE2 in accordance with a select signal S as is received at the input terminal.

The mode selector 14 contains a comparator 114 which detects a level of a mode select signal S applied to a specific pin of the memory device, and sets the mode signal MODE1 or MODE2 in a logic "1" level in accordance with the select signal S. More specifically, the comparator 114 receives the select signal S at the noninverting input terminal and a reference potential $Vcc + \alpha$ ($\alpha$ is 7 V, for example), at the inverting terminal. When the result of the comparison by the comparator 114 satisfies $Vcc + \alpha < S$, the comparator 114 produces the mode signal MODE1 (="1"). When the result satisfies $Vcc + \alpha > S$, the comparator 114 produces the mode signal MODE2 (="1").

The description to follow is the detail of writing data into the memory circuit 10 of the memory device when it is assembled into a system.

In this write mode, the first program pulse generator 11 is used, and the write operation progresses in a write sequence as shown in FIG. 2, for example. A program enable holds only when conditions 1 to condition "n" are satisfied in this order. The condition "i" (i = 1 to n) indicates any of the following meanings: 1) specific data is written into a specific address in the memory circuit 10; 2) data is read out of a specific memory location; 3) an external pin is set in a certain status; and 4) others. In the instant embodiment, the condition "i" indicates the item 1) above.

As shown, the first program pulse generator 11 is made up of "n" comparators 21-1 to 21-n, (n+1) D-type flip-flops 22-1 to 22-(n+1), (n−1) AND gates 23-1 to 23-(n−1), and one inverter 24.

The comparators 21-1 to 21-n progressively compare addresses and data that are delivered from a CPU (not shown) respectively with reference addresses and reference data. The conditions "1" to "n" (FIG. 2) are judged on the basis of the results of the comparisons also progressively. The output signal of the comparator 21-1 for judging the condition 1 is applied to the input data terminal of the flip-flop (F/F) 22-1. The output signal of the F/F 22-1 and the comparator 21-2 for judging the condition 2 are applied to the AND gate 23-1. The output signal of the AND gate 23-1 is inputted to the data input terminal of the F/F 22-2. In this way, the output signal of the F/F 22-i and the output signal of the comparator 21-(i+1) for judging the condition (i+1) are inputted to the AND gate 23-i. The output signal of the AND gate 23-i is applied to the data input terminal of the F/F 22-(i+1). The output signal of the F/F 22-n is applied to the reset terminal of a F/F 22-(n+1). The output signal of the F/F 22-(n+1) is fed back to its data input terminal D through an inverter 24. The reset terminals of the F/Fs 22-1 to 22-n are coupled for reception with the mode signal MODE1 delivered from the mode selector 14. The clock input terminals of the F/Fs 22-1 to 22-(n+1) are coupled for reception with a write enable signal $\overline{WE}$ derived from the CPU (not shown). The F/F 22-(n+1) produces a program pulse PGM.

The second program pulse generator 12 is made up of an inverter 31, and two AND gates 32 and 33. A chip enable signal $\overline{CE}$ derived from a ROM writer (not shown) is inputted to the inverter 31. An output enable signal $\overline{OE}$ and a write enable signal $\overline{WE}$, that are derived from the ROM writer, are applied to the AND gate 32. Another mode signal MODE2 from the mode selector 14, the output signal of the inverter 31 and the output signal of the AND gate 32 are applied to the AND gate 33. A program pulse signal PGM is derived from the AND gate 33.

An operation of the nonvolatile semiconductor memory device thus arranged will be described with reference to FIG. 1.

When a select signal S of a logic "1" level is applied to the mode selector 14, the selector 14 sets the mode signal MODE1 in a logic "1" level. Upon receipt of this mode signal MODE1, the F/Fs 22-1 to 22-n are released from a reset state. Under this condition, the first program pulse generator 11 is ready for operation. Subsequently, the CPU successively produces address signals and data signals. In synchronism with the outputting of these signals, the write enable signal $\overline{WE}$ is pulsed to a logic "0" level. If the respective conditions successively holds in the order as shown in FIG. 2, the output signals of the comparators 21-1 to 21-n successively are pulsed to logic "1" level. When the write enable signal $\overline{WE}$ is pulsed to "0" level "n" times, the output signal of the F/F 22-n becomes high ("1" in logic level). When any of the conditions in FIG. 2 fails to hold or the order in which the respective conditions successively hold is different from the normal one, the output signal of the AND gate 23-(n−1) goes low ("0" in logic level), and accordingly the output signal of the F/F 22-n will not go high.

The F/F 22-(n+1) is placed in a reset state until the respective conditions hold and the output signal of the F/F 22-n goes high. Thereafter, the CPU applies a write address signal and a data signal to the memory circuit 10. In synchronism with the outputting of those signals, the write enable signal $\overline{WE}$ goes low. Since the output signal of the inverter 24 has been set in a logic "1" level, at the leading edge of the write enable signal $\overline{WE}$, the output signal of the F/F 22-(n+1), or the program pulse PGM, goes high. In turn, the data signal is written into the memory circuit 10. Subsequently, a dummy address and data are outputted to the memory circuit 10, from the CPU. In synchronism with this, the write enable signal $\overline{WE}$ goes low. At this time, the output signal of the inverter 24 has been set in logic "0", the program pulse PGM goes low at the leading edge of the write enable signal $\overline{WE}$. Here, the programming operation for the memory circuit ends. For verifying the data written or programmed into the memory circuit, the CPU (not shown) applies a read address signal and a data signal to the memory circuit 10.

In this way, data can readily be written or rewritten into the memory circuit of the memory device being assembled into a system by setting the mode signal MODE1 in logic "1" level. In case where the number of comparators 21 is increased, and a write sequence up to the program enable status is made complicated, it is possible to reduce a probability that improper operations occur during the system operation.

When a mode select signal S applied is in logic "0" level, the mode selector 14 sets the mode signal MODE2 in logic "1" level. The mode signal MODE2 of logic "1" level is applied to the AND gate 33 in the second program pulse generator 12, to place the generator 12 in a ready-for-operation state. The generator 12 receives a chip enable signal $\overline{CE}$, output enable signal $\overline{OE}$. and write enable signal $\overline{WE}$ from the ROM writer (not shown) at the timings (see FIG. 4). At this time, the write enable signal $\overline{WE}$ outputted from the ROM writer remains high in logic level. Accordingly, if the mode signal MODE2 is set in logic "1" level, data can be programmed and reprogrammed into the memory device by an ordinary ROM writer, before it is assembled into a system.

The description to follow is the details of the techniques to write data into the memory device by a ROM writer before it is assembled into a system and the techniques to write data into the memory device being assembled into a system under control of control signals derived from the CPU.

As already described, in the case of the memory device, which uses a ROM writer, much time is taken for writing data. Because of this, this type of the memory device uses a special data write sequence as shown in FIG. 4 for writing data, whereas the control signals from the CPU are used for the same purpose in the memory device of the type in which data write is done after the memory device is assembled into a system, which will be described later. As shown in FIG. 4, an address, write data and a high potential Vpp are first supplied to the memory circuit 10. A chip enable signal $\overline{CE}$ then drops to logic "0" level. Under this condition, data is written into the memory circuit. An output enable signal $\overline{OE}$ then drops to logic "0" level. Under this condition, the data written is read out, and the read data and the write data are compared for verifying whether the data written is correct or not. Normally, such an operation is called a verify operation. If both the data are not coincident with each other, it is judged that the written data is incorrect. Then, the write data is written into the memory circuit again. If both the data are coincident with each other, it is judged that the written data is correct. In this case, the chip enable signal $\overline{CE}$ drops to logic "0" level, to allow additional write data to be written into the memory circuit.

The write sequence for the memory device using a ROM writer for writing data thereinto is different from a write sequence by the CPU that is used for writing data into the memory device assembled into a system. Therefore, it is impossible to write data into the memory device of the type using a ROM writer after it is assembled into a system. To cope with this, proposals as shown in FIGS. 6, 7 and 8 have been made.

Figure 6:
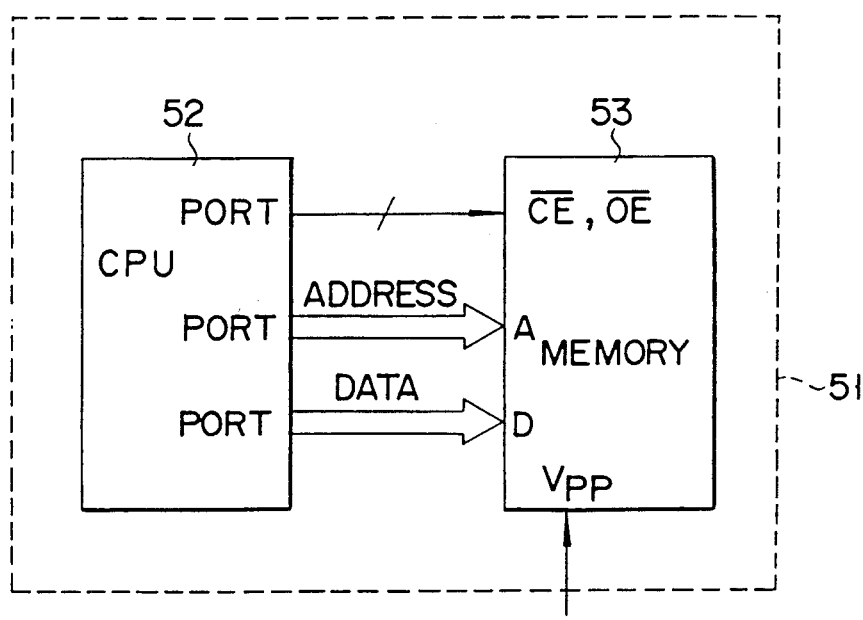
FIG. 6 an arrangement of a circuit which is used for writing data into a memory circuit of a memory device assembled into a system, the memory device being of the type in which data is written into the memory circuit by a ROM writer.

In a system of FIG. 6, three ports of a CPU 53 in a system 51 are used; the first port for providing a chip enable signal $\overline{CE}$ and an output enable signal $\overline{OE}$, the second port for providing an address signal, and the third port for providing a write data signal. Those signals are generated at the timings as shown in FIG. 4, and applied to a memory circuit 53. Thus, in this proposal, the ports of the CPU 52 are used for writing data into the memory circuit 53. Because of this, the CPU 52 cannot exercise its functions necessary for system processings.

Figure 7:
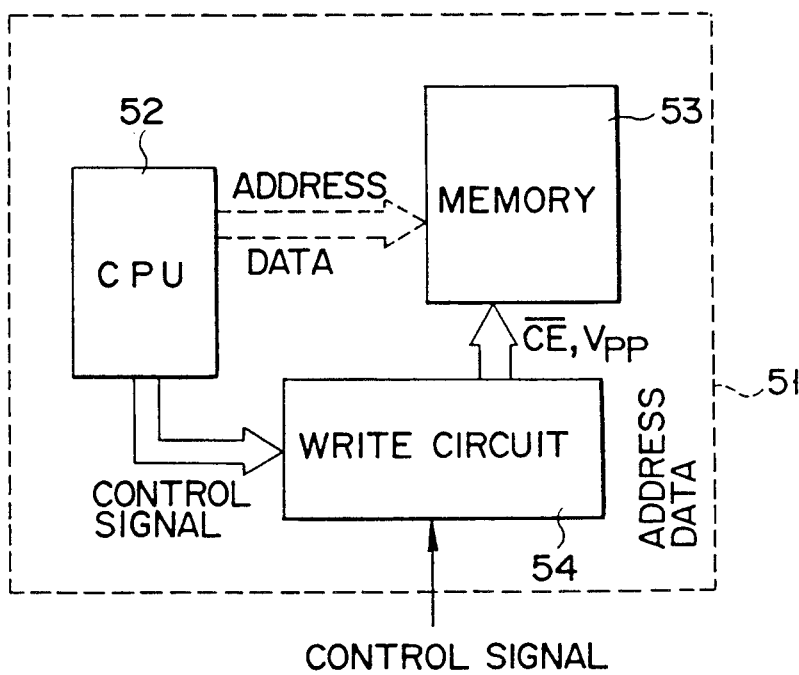
FIG. 7 shows another arrangement of a circuit which is used for writing data into a memory circuit of a memory device assembled into a system, the memory device being of the type in which data is written into the memory circuitry a ROM writer.

In a system of FIG. 7, a write only circuit 54 is provided in addition to the CPU 52 and the memory circuit 53. The write only circuit 54 is used for writing data into the memory circuit 53. Use of the additional write only circuit 54 makes the system configuration complicated, and requires an additional chip area for the circuit 54. In this respect, the FIG. 7 system is unpreferable.

Figure 8:
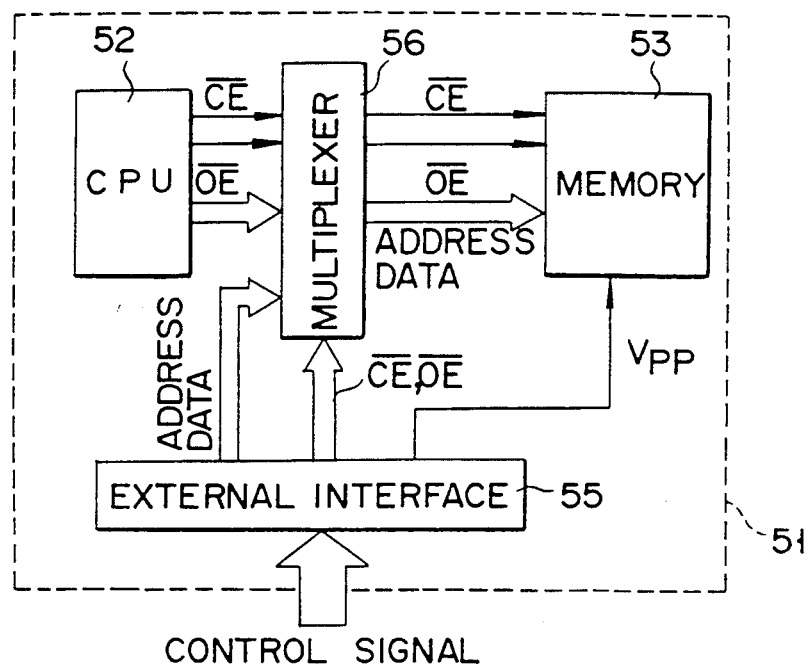
FIG. 8 shows yet another arrangement of a circuit which is used for writing data into a memory circuit of a memory device assembled into a system, the memory device being of the type in which data is written into the memory circuit by a ROM writer.

A system of FIG. 8 uses an external interface 55 and a multiplexer 56 for selectively leading the output signals of the CPU 52 and those of the external interface 55 to the memory circuit 53, in addition to the CPU 52 and the memory circuit 53. The interface 55 is used for writing data into the memory circuit 53. In this instance, a connector for the interface 55 must be used and it must be separated from the interface with the CPU 52.

As described above, the proposals realizing the data write into the memory device of the type using a ROM writer for writing data, involves the above problems. Possible solutions to the problems are to prohibit data from being written into the memory circuit of the memory device after it is assembled into a system, and to write data into the memory device assembled into a system by using an additional expensive device.

Figure 9:
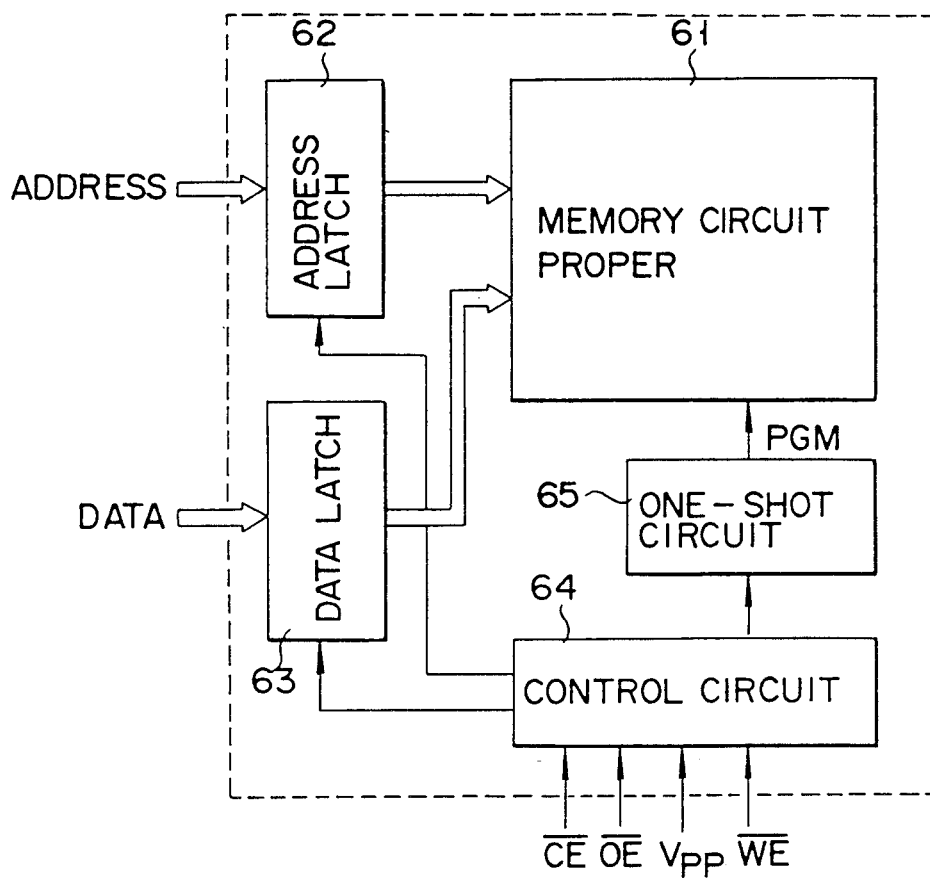
FIG. 9 shows an arrangement of a circuit which is used for writing data into a memory circuit of a memory device of the type in which data is written into the memory circuit assembled into a system.
Figure 10:
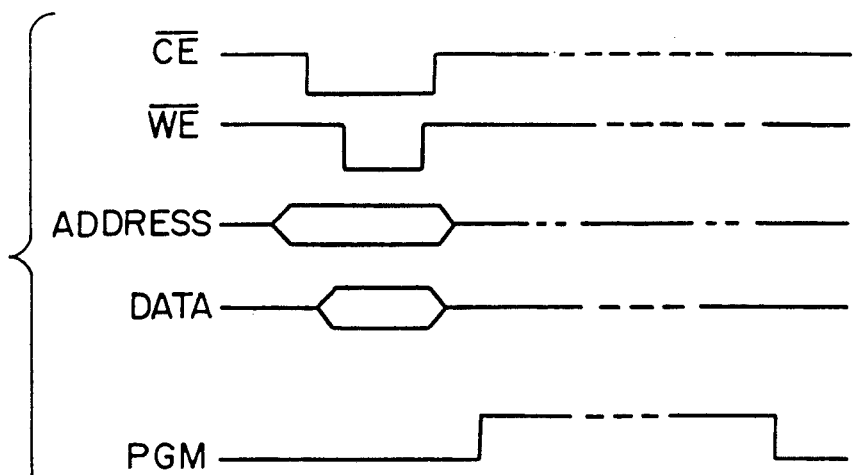
FIG. 10 is a timing chart showing a data write operation of the memory device of FIG. 9.

The memory device, such as an EEPROM of the type in which after the memory device is assembled into a system, and data write progresses under control of control signals issued from a CPU contained in the system, uses an ordinary RAM write sequence as shown in FIG. 5, not the write sequence of FIG. 4. The durations of the control signals from the general CPU are greatly different from a data write time, or Tpw, for writing data to the memory device. Usually, the former ranges from several tens to several hundreds nS, while the latter several hundreds uS to several mS. This type of the memory device is configured as shown in FIG. 9. As shown, the memory device is composed of a memory circuit proper 61, an address latch 62, a data latch 63, a controller 64, and a one-shot pulse generator 65. The address latch 62 latches an address signal derived from a CPU, for example. The data latch 63 latches a data signal derived from the CPU, for example. The controller 64 receives a chip enable signal $\overline{CE}$, an output enable signal $\overline{OE}$, a write high potential Vpp, and a write enable signal $\overline{WE}$. In the memory device thus configured, the address latch 62 latches an address signal at the trailing edge of the write enable signal $\overline{WE}$ supplied from the controller 64. The data latch 63 latches a data signal at the leading edge of the write enable signal $\overline{WE}$. Then, these signals are transferred to the memory circuit 61. The one-shot pulse generator 65 generates, at the trailing edge of the write enable signal $\overline{WE}$, a program pulse PGM (write pulse) whose duration is much longer than that of the write enable signal $\overline{WE}$, as shown in FIG. 10. The program pulse PGM is applied to the memory circuit 61. During the period of the program pulse PGM, the data signal latched in the data latch 63 is written into a memory cell of the memory circuit 61 that is specified by the address signal latched in the address latch 62.

In the memory device of FIG. 9, the one-shot pulse generator 65 used requires a large chip area when the memory device is fabricated into an integrated circuit. Increase of the chip area leads to increase of cost to manufacture. Further, the one-shot pulse generator 65 installed within the memory device is instable in operation. This results in nonuniformity of data written memory cells among the memory circuits. Consequently, a reliability of the memory device is unsatisfactory. An approach is allowed in which the duration of the program pulse PGM generated by the one-shot pulse generator 65 is set to be satisfactorily long, allowing for the nonuniformity of the data written memory cells among the memory circuits. In this approach, unnecessary time is consumed for writing data into the memory cells into which data is easy to be written. As a consequence, a whole write time becomes longer.

Figure 11:
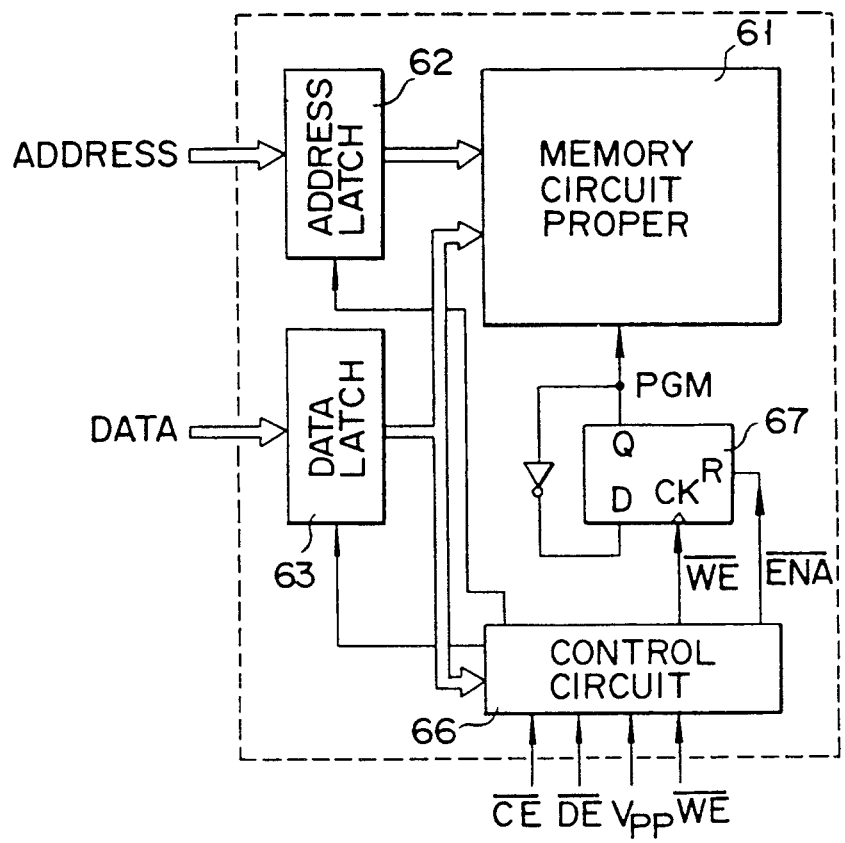
FIG. 11 shows another arrangement of a circuit which is used for writing data into a memory circuit of a memory device of the type in which data is written into the memory circuit of the memory device assembled into a system.

In the case of the memory device without the write control means as shown in FIG. 9, a write time must be controlled by an external CPU. A circuit arrangement of the memory device whose write time is controlled by the external CPU is shown in FIG. 11.

As shown, the memory device is composed of a memory circuit proper 61, an address latch 62, a data latch 63, a controller 66, and a D-type flip-flop (F/F) 67. The address latch 62 latches an address signal derived from a CPU. The data latch 63 latches a data signal derived from the CPU. The controller 66 receives a chip enable signal $\overline{CE}$, an output enable signal $\overline{OE}$, a write high potential Vpp, a write enable signal $\overline{WE}$, and the data latched in the data latch circuit 63.

In the memory device thus configured, the data write operation progresses as shown in FIG. 12. The CPU produces a signal representative of specific data, e.g., hexadecimal "AA". The data is latched in the data latch 63. At this time, an enable signal $\overline{ENA}$ derived from the controller 66 goes low ("0" in logic level). When the enable signal $\overline{ENA}$ is in logic "1" level, the F/F 67 is reset. The going low of the enable signal $\overline{ENA}$ is transferred as a program enable command to the F/F 67, thereby to set the F/F 67 in an enable state. At the trailing edge of the enable signal $\overline{WE}$, the address is latched in the address latch 62. At the leading edge of the write enable signal $\overline{WE}$, the data is latched in the data latch 63. And then both are transferred to the memory circuit 61. At the leading edge of the write enable signal $\overline{WE}$ derived from the controller 66, the F/F 67 is triggered, so that the program pulse PGM in logic "1" is supplied to the memory circuit 61. Upon receipt of this pulse, the programming operation of one byte starts. At the leading edge of the write enable signal $\overline{WE}$, the F/F 67 is triggered. The program pulse PGM is pulsed from the logic "1" level to the logic "0" level. At this point, the programming operation terminates. Subsequently, the CPU produces specific data, e.g., hexadecimal "BB", and the data is latched in the data latch 63. In turn, the enable signal $\overline{ENA}$ from the controller 66 goes high. The going high of the enable signal is transferred as a program disable command to the F/F 67.

Also in this case, the write sequence is substantially equal to that of writing data into a RAM under control of the CPU. There is the possibility that the improper data write occurs due to system noise, for example. To avoid the improper write of data, a designer tends to make the write sequence complicated. In the write sequence shown in FIG. 12, the program enable command is detected from only the writing operation of the data "AA". Alternatively, the program enable command can be detected through a succession of write operations of data "AA", "55", "FF" and "00", as shown in FIG. 13. Such a complicated write sequence rejects use of the conventional ROM writer for writing data, and increases the write time. The increased write time is tolerable for the memory device assembled into a system, because the write error must be prevented, but is untolerable for the memory device of the type using a ROM writer, because it increases the time and cost to manufacture.

The techniques to write data into the memory device by a ROM writer before it is assembled into a system and the techniques to write data into the memory device being assembled into a system under control of control signals derived from the CPU, have the problems as described above. It is noted, however, that the above problems can be solved by using the mode selector 14 in the memory device (FIG. 1).

It should be understood that the present invention is not limited to the above-mentioned embodiment, but may be variously changed and modified within the scope of the present invention.

In the above-mentioned embodiment, the mode selector 14 detects a select signal S inputted to a specific pin of the memory device chip, and sets one of the mode signals MODE1 and MODE2 in logic "1" level in accordance with the detected signal. Such a selective level setting of the mode signal MODE1 or MODE2 may be based on, for example, 1) detection of writing of specific data into a memory cell of a specific address, 2) detection of applying a voltage in excess of a normal logic level to an external pin, or 3) detection of applying a clock signal to an external pin.

As seen from the foregoing description, according to the present invention, data can be written or re-rewritten into a memory circuit before it is assembled into a system, by using a ROM writer. Further, the memory circuit assembled into a system can readily be reprogrammable.

What is claimed is:

1. A nonvolatile semiconductor memory device comprising:
   a memory circuit including a plurality of nonvolatile memory cells;
   mode select means, capable of generating at least two mode signals, for detecting a signal indicative of a specific operation to said memory circuit, and for selecting one of said mode signals in accordance with said detected signal;
   control means for generating at least two writ enable signals, each signal allowing data to be written into said memory circuit in a different manner in accordance with said mode signal selected by said mode select means;

wherein said control means includes a plurality of judging means for judging as to whether or not said specific operation has been applied to said memory circuit; and wherein said plurality of judging means include a plurality of comparators for comparing input addresses with reference addresses and for comparing input data with reference data.

2. The nonvolatile semiconductor memory device according to claim 1, in which said control means further includes a means for outputting said write enable signal when the results of the comparisons by said plurality of comparators of said judging means are all coincident with one another.

3. The nonvolatile semiconductor memory device according to claim 2, in which said write enable signal outputting means includes a flip-flog circuit.

4. The nonvolatile semiconductor memory device according to claim 1, in which said plurality of comparators are four comparators.

5. A nonvolatile semiconductor memory device comprising:

a memory circuit including a plurality of nonvolatile memory cells;

mode select means, capable of generating at least two mode signals, for detecting a signal indicative of a specific operation to said memory circuit, and for selecting one of said mode signals in accordance with said detected signal;

pulse generating means for generating a first and a second program pulse, each pulse allowing data to be written into said memory circuit in a different manner in accordance with said mode signal selected by said mode select means;

wherein said pulse generating means includes a plurality of judging means for judging as to whether or not said specific operation has been applied to said memory circuit; and wherein said plurality of judging means include a plurality of comparators for comparing input addresses with reference addresses and for comparing input data with reference data.

6. The nonvolatile semiconductor memory device according to claim 5, in which said pulse generating means further includes a means for outputting one of said first and second program pulses when the results of the comparisons by said plurality of comparators of said judging means are all coincident with one another.

7. The nonvolatile semiconductor memory device according to claim 6, in which said outputting means includes a flip-flop circuit.

8. The nonvolatile semiconductor memory device according to claim 5, in which said plurality of comparators are four comparators.

* * * * *

UNITED STATES PATENT AND TRADEMARK OFFICE
CERTIFICATE OF CORRECTION

PATENT NO. : 5,062,078
DATED : October 29, 1991
INVENTOR(S) : Norimasa Arakawa

It is certified that error appears in the above-identified patent and that said Letters Patent is hereby corrected as shown below:

Claim 1, column 8, line 64, after "operation" insert --applied--.

Claim 1, column 8, line 67, change "writ" to --write--.

Claim 3, column 9, line 20, change "flip-flog" to --flip-flop--.

Claim 5, column 10, line 1, after "operation" insert --applied--.

Signed and Sealed this

First Day of June, 1993

Attest:

MICHAEL K. KIRK

*Attesting Officer*    Acting Commissioner of Patents and Trademarks